United States Patent
Nakamura et al.

(10) Patent No.: US 7,358,548 B2
(45) Date of Patent: Apr. 15, 2008

(54) SEMICONDUCTOR INTEGRATED CIRCUIT HAVING LAYOUT IN WHICH BUFFERS OR PROTECTION CIRCUITS ARE ARRANGED IN CONCENTRATED MANNER

(75) Inventors: Tadashi Nakamura, Itami (JP); Kiyohiko Sakakibara, Tokyo (JP); Yutaka Takikawa, Itami (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/328,194

(22) Filed: Jan. 10, 2006

(65) Prior Publication Data

US 2006/0163615 A1 Jul. 27, 2006

(30) Foreign Application Priority Data

Jan. 27, 2005 (JP) .............................. 2005-020111

(51) Int. Cl.
*H01L 29/00* (2006.01)
*H01L 27/10* (2006.01)
(52) U.S. Cl. ...................... 257/203; 257/499; 257/503; 257/E23.079; 257/E23.142
(58) Field of Classification Search ............... 257/202, 257/208, 203, 499, 503; 716/16, 17
See application file for complete search history.

(56) References Cited

U.S. PATENT DOCUMENTS

| | | | | |
|---|---|---|---|---|
| 4,454,591 A * | 6/1984 | Lou | ............................ | 710/305 |
| 6,725,443 B1 * | 4/2004 | Pang et al. | ..................... | 716/17 |
| 6,847,577 B2 * | 1/2005 | Ishiguro | ................ | 365/230.03 |
| 7,003,750 B2 * | 2/2006 | Valine | ........................... | 716/11 |
| 7,006,370 B1 * | 2/2006 | Ramesh et al. | ................ | 365/63 |
| 7,170,114 B2 * | 1/2007 | Shimanuki | .................. | 257/203 |
| 2003/0096501 A1 * | 5/2003 | Ootsuka et al. | ............. | 438/689 |
| 2004/0004855 A1 * | 1/2004 | Kurth et al. | ................. | 365/149 |
| 2005/0139893 A1 * | 6/2005 | Hofmann et al. | ........... | 257/314 |

FOREIGN PATENT DOCUMENTS

JP   08-125130   5/1996

* cited by examiner

*Primary Examiner*—Evan Pert
(74) *Attorney, Agent, or Firm*—McDermott Will & Emery LLP

(57) ABSTRACT

Buffers are arranged in a concentrated manner in a region distant from pads. The region refers to a region in a main region of a semiconductor integrated circuit, except for a central processing unit, a non-volatile memory and a volatile memory. As the buffer requiring a large area is not provided around the pad, a pitch between the pads or a pitch between the pad and an internal circuit (such as the central processing unit) can be made smaller and hence a chip size can be reduced. Therefore, a semiconductor integrated circuit capable of achieving a reduced chip size can be provided.

8 Claims, 10 Drawing Sheets

SEMICONDUCTOR INTEGRATED CIRCUIT HAVING LAYOUT IN WHICH BUFFERS OR PROTECTION CIRCUITS ARE ARRANGED IN CONCENTRATED MANNER

BACKGROUND OF THE INVENTION

1. Field of the Invention

The present invention relates to a semiconductor integrated circuit, and more particularly to a layout in a semiconductor chip.

2. Description of the Background Art

Recently, from a viewpoint of cost reduction, reduction in a chip area has been demanded in a semiconductor integrated circuit such as a microcomputer. In addition, higher operation speed and lower power consumption have also been demanded in a semiconductor integrated circuit.

For example, Japanese Patent Laying-Open No. 08-125130 discloses a semiconductor integrated circuit aiming to stabilize a circuit operation by reducing crosstalk or noise due to capacitive coupling between signal lines located in different interconnection layers in a semiconductor integrated circuit having a multilayer interconnection. Having a plurality of metal interconnection layers, the semiconductor integrated circuit includes a signal line as well as a ground line and a power supply line arranged in parallel to each other on respective opposing sides of the signal line in an identical interconnection layer and fixed to a ground potential and a power supply voltage potential respectively. The semiconductor integrated circuit is characterized in that the signal line, the ground line and the power supply line are arranged proximate to each other to such an extent that a spacing therebetween is set to at most a thickness of an interlayer insulating layer electrically insulating interconnections located in different interconnection layers.

In the conventional semiconductor integrated circuit, a pad and an I/O buffer (or a protection circuit such as an off-transistor and a diode) are arranged proximate to each other in a periphery of a chip. When the pad and the I/O buffer (or the protection circuit) are arranged in such a manner, reduction in a chip size is restricted.

For example, if a semiconductor integrated circuit implements a microcomputer, circuits such as a CPU (Central Processing Unit), an ROM (Read Only Memory), an RAM (Random Access Memory), and the like are mounted on a chip. Here, each circuit is constituted of elements such as an MOS (Metal Oxide Semiconductor) transistor or a capacitor. As these elements are reduced in size through microfabrication, scale of each circuit can be made smaller.

On the other hand, the size of the pad or the I/O buffer (or the protection circuit) cannot be made smaller, along with size reduction of the circuit such as a CPU. As the I/O buffer or the protection circuit protects an internal circuit (such as a CPU, an ROM, an RAM, and the like) against noise or surge introduced from the outside, sufficient area thereof is required. In the conventional semiconductor integrated circuit, the I/O buffer or the protection circuit is arranged in proximity to the pad. Therefore; if a protection circuit having a large area is provided in a region between pads or a region between the pad and the CPU, length of four sides of the chip is determined by the pad and the protection circuit, which prevents reduction in chip size.

Meanwhile, if the area of the pad or a spacing between the pads is significantly made smaller, defects in manufacturing may increase in an assembly step such as dicing or wire bonding. Therefore, an area of the pad or a pitch between the pads cannot significantly be changed in an attempt to reduce the chip size.

In preparing a broader product range in order to meet various demands from customers, generally, product variety is reinforced by varying a capacity of the RAM or the ROM, without substantially modifying the CPU. Even if the CPU, the RAM and the ROM are arranged so as not to leave an empty space in the semiconductor chip in a certain product, however, there is an empty space created in the chip in a new product provided with an RAM having a size smaller than in the conventional product. In such a product as well, the I/O buffer or the protection circuit has been arranged proximate to the pad.

In summary, such measures as-reduction in size of a circuit element for reducing the chip size or arrangement of the CPU, the RAM and the ROM so as not to leave an empty space have conventionally been taken. Once the chip size is determined, however, it has not been easy to reduce the chip size in the case of change in the size of the RAM or the ROM.

SUMMARY OF THE INVENTION

An object of the present invention is to provide a semiconductor integrated circuit capable of achieving reduction in a chip size.

In summary, a semiconductor integrated circuit according to the present invention includes: a central processing unit; a non-volatile memory; a volatile memory; a plurality of buffers or a plurality of protection circuits; a plurality of pads; and a plurality of metal interconnections. The non-volatile memory stores information on processing performed in the central processing unit in a non-volatile manner. The volatile memory temporarily stores the information. The plurality of buffers or the plurality of protection circuits are arranged in a region in a main region including the central processing unit, the non-volatile memory and the volatile memory, except for the central processing unit, the non-volatile memory and the volatile memory, on a main surface of a semiconductor substrate. The plurality of pads are provided corresponding to the plurality of buffers or the plurality of protection circuits, respectively. The plurality of metal interconnections directly connect the plurality of buffers or the plurality of the protection circuits to corresponding ones of the plurality of pads, respectively.

Therefore, a primary advantage of the present invention is that the I/O buffers or the protection circuits are arranged in a concentrated manner in the region on the surface of the semiconductor substrate, except for the region for the CPU, the RAM, the ROM, and the like, so that a distance between the pads or a spacing between the pad and the circuit such as the CPU can be made smaller, thereby reducing the chip size.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
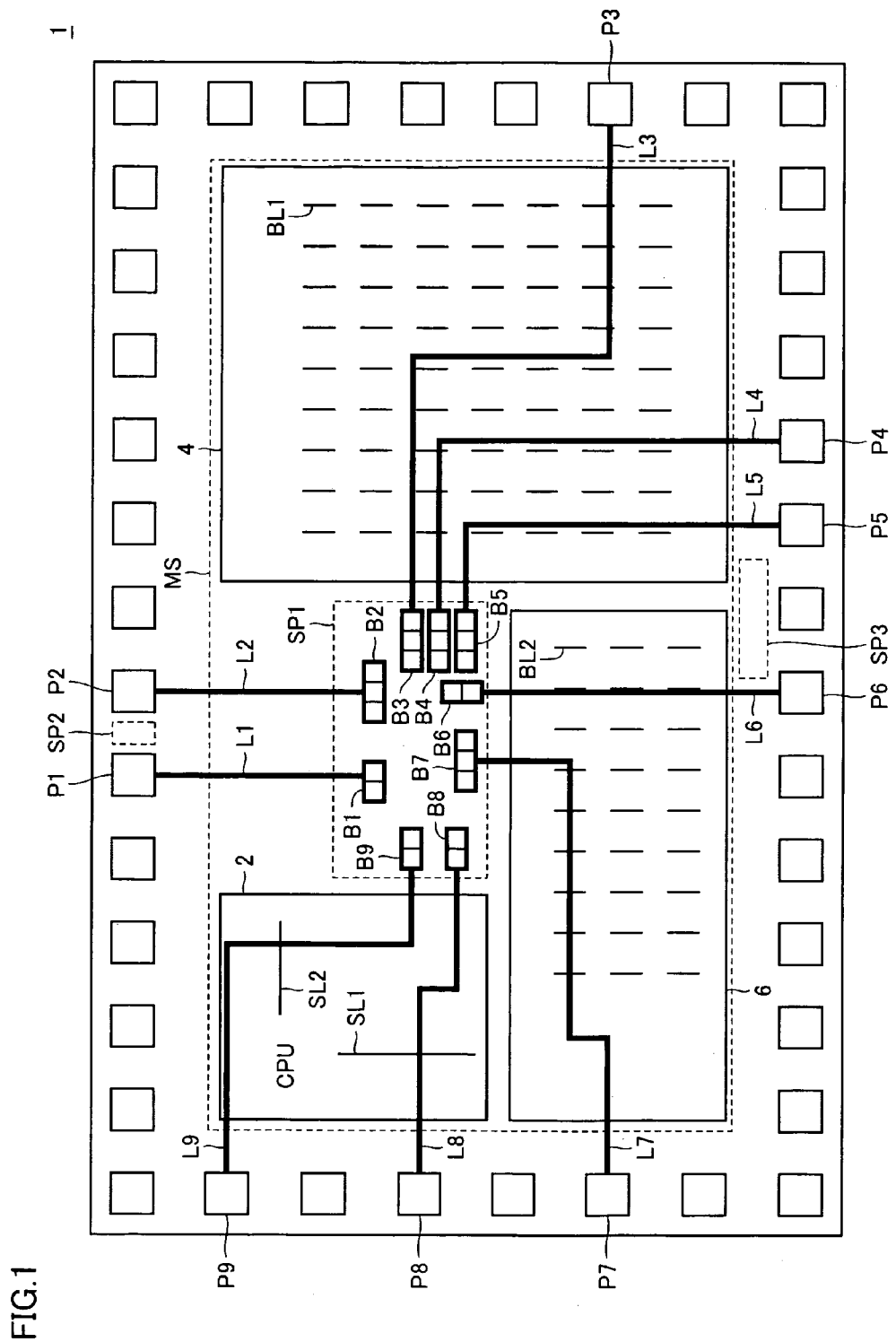
FIG. 1 shows a layout of a semiconductor integrated circuit in a first embodiment.

An embodiment of the present invention will be described hereinafter in detail with reference to the drawings. The same or corresponding elements have the same reference characters allotted.

First Embodiment

FIG. 1 shows a layout of a semiconductor integrated circuit in a first embodiment. Referring to FIG. 1, a semiconductor integrated circuit 1 includes a central processing unit (denoted as CPU in the drawing) 2, a non-volatile memory 4 storing information on prescribed processing performed in central processing unit 2 in a non-volatile manner, and a volatile memory 6 temporarily storing the information. Non-volatile memory 4 implements, for example, a flash memory. -Volatile memory 6 implements, for example, an SRAM (Static Random Access Memory).

Semiconductor integrated circuit 1 further includes buffers B1 to B9 serving as I/O buffers. Buffers B1 to B9 are arranged in a concentrated manner in a single region SP1 in a main region MS on a surface of a semiconductor substrate, except for the region for central processing unit 2, non-volatile memory 4 and volatile memory 6.

Semiconductor integrated circuit 1 further includes pads P1 to P9 provided corresponding to I/O buffers B1 to B9 respectively and metal interconnections L1 to L9 directly connecting buffers B1 to B9 to pads P1 to P9 respectively.

Semiconductor integrated circuit 1 has a multilayer interconnection. Metal interconnections L1 to L9 are formed in an identical interconnection layer. Each of metal interconnections L1 to L9 is provided in an interconnection layer higher than any of an interconnection layer where a metal interconnection included in central processing unit 2 is provided, an interconnection layer where a metal interconnection included in non-volatile memory 4 is provided, and an interconnection layer where a metal interconnection included in volatile memory 6 is provided, relative to the surface of the semiconductor substrate.

Specifically, metal interconnections L3 to L5 are provided above a plurality of bit lines BL1 included in non-volatile memory 4. Metal interconnections L6, L7 are provided above a plurality of bit lines BL2 included in volatile memory 6. Metal interconnections L8, L9 are provided in the interconnection layer above signal lines SL1, SL2 included in central processing unit 2.

Characteristics of a configuration of semiconductor integrated circuit 1 according to the first embodiment will be summarized. Buffers B1 to B9 are arranged in a concentrated manner in region SP1 distant from pads P1 to P9. Region SP1 is a region in main region MS except for central processing unit 2, non-volatile memory 4 and volatile memory 6. As the buffer requiring a large area is not provided around the pad, a spacing between the pads or a spacing between the pad and the internal circuit (such as central processing unit 2) can be made smaller, thereby reducing the chip size.

In the semiconductor integrated circuit according to the present invention, a length of the metal interconnection connecting the pad to the buffer is longer than in the conventional semiconductor integrated circuit. Therefore, the semiconductor integrated circuit according to the present invention may be more susceptible to noise or surge due to larger interconnect resistance between the pad and the buffer. Such a problem, however, can be solved by forming each of metal interconnections L1 to L9 in a top interconnection layer.

In general, in a multilayer interconnect structure, a metal interconnection in an upper layer has higher degree of freedom-in design with regard to a width or a thickness of an interconnection. Therefore, if each of metal interconnections L1 to L9 is arranged in the top interconnection layer, the width or thickness thereof can be set to attain sufficiently small interconnect resistance between the pad and the buffer.

Figure 2:
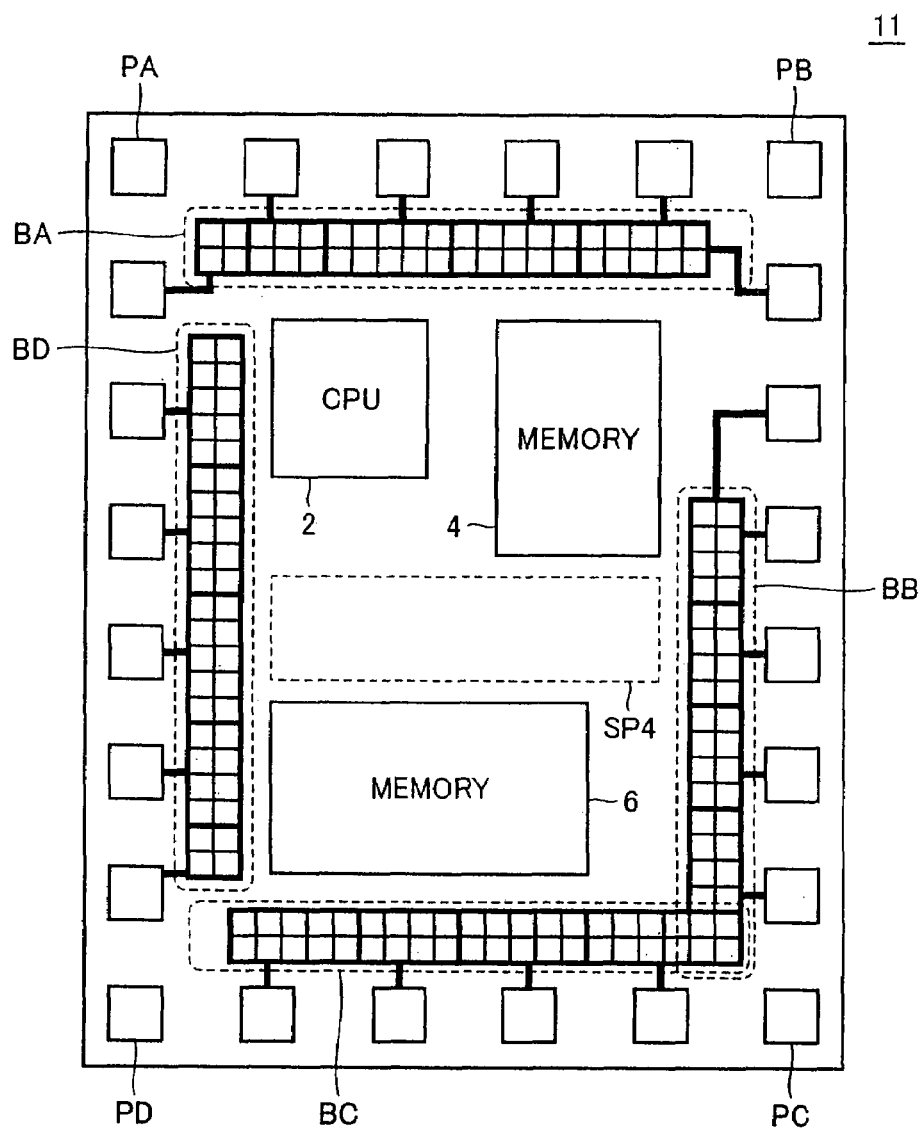
FIG. 2 shows a layout of a semiconductor integrated circuit according to an arrangement method in related art different from the first embodiment.

FIG. 2 shows a layout of a semiconductor integrated circuit according to a different arrangement method in related art. Referring to FIG. 2, a semiconductor integrated circuit 11 is different from semiconductor integrated circuit 1 in FIG. 1 in including buffers BA to BD provided proximate to the pad. As the configuration of semiconductor integrated circuit 11 is otherwise the same as that of corresponding portions of semiconductor integrated circuit 1, description thereof will not be repeated.

A region SP4 is provided inside semiconductor integrated circuit 11. In a certain semiconductor integrated circuit, even if region SP4 is not provided, it is created by reducing the size of non-volatile memory 4 or by reducing the size of volatile memory 6.

In the different layout, even if an empty space having an area sufficient for concentrated arrangement of buffers is provided on the surface of the semiconductor substrate, reduction in the chip size has been restricted, because the buffers or the protection circuits have been provided proximate to the pad.

In addition, in the layout where the pads are arranged along four sides of the chip, it is not possible to arrange the buffer or the protection circuit around pads PA to PD provided in four corners respectively. Namely, the empty space created around the pad in the corner has also been a factor to restrict reduction in the chip size.

Meanwhile, in semiconductor integrated circuit 1 in FIG. 1, buffers B1 to B9 are arranged in region SP1 in a concentrated manner. Accordingly, by efficiently utilizing the empty space in the chip, the chip is made smaller. It is noted that the-buffer and the protection circuit may be provided in region SP1 in FIG. 1. Alternatively, the protection circuit may be provided in a region between the pads or in a region between the pad and the internal circuit. Specifically, the protection circuit may be provided in a region SP2 between pad P1 and pad P2 or a region SP3 between pads P5, P6 and non-volatile memory 4, volatile memory 6.

Figure 3:
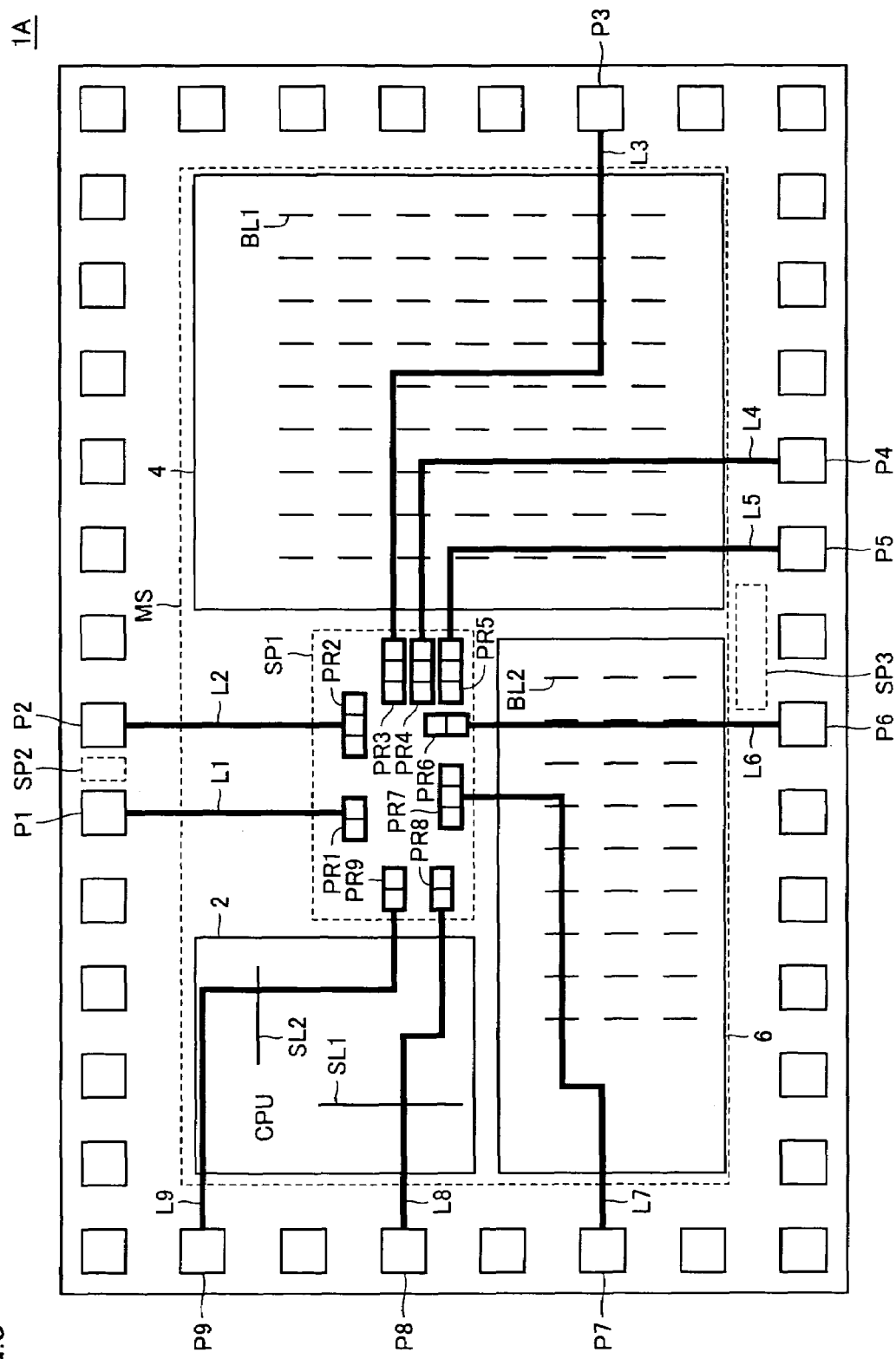
FIG. 3 shows a layout of the semiconductor integrated circuit according to a variation of the first embodiment.

FIG. 3 shows a layout of the semiconductor integrated circuit according to a variation of the first embodiment. Referring to FIG. 3, a semiconductor integrated circuit 1A is different from semiconductor integrated circuit 1 in FIG. 1 in including protection circuits PR1 to PR9 provided in region SP1, instead of buffers B1 to B9. The protection circuit is represented, for example, by an off-transistor or a diode. As the configuration of semiconductor integrated circuit 1A is otherwise the same as that of corresponding portions of semiconductor integrated circuit 1, description thereof will not be repeated. As can be seen in the variation of the first embodiment, the chip size can be reduced also by arranging the protection circuit in the empty space in the chip.

In the variation of the first embodiment, buffers B1 to B9 may be provided in region SP1 or in region SP2 or SP3.

As described above, according to the first embodiment, the buffers or the protection circuits are arranged in a concentrated manner in the empty space on the surface of the semiconductor substrate, so that the chip size of the semiconductor integrated circuit can be reduced.

Second Embodiment

Figure 4:
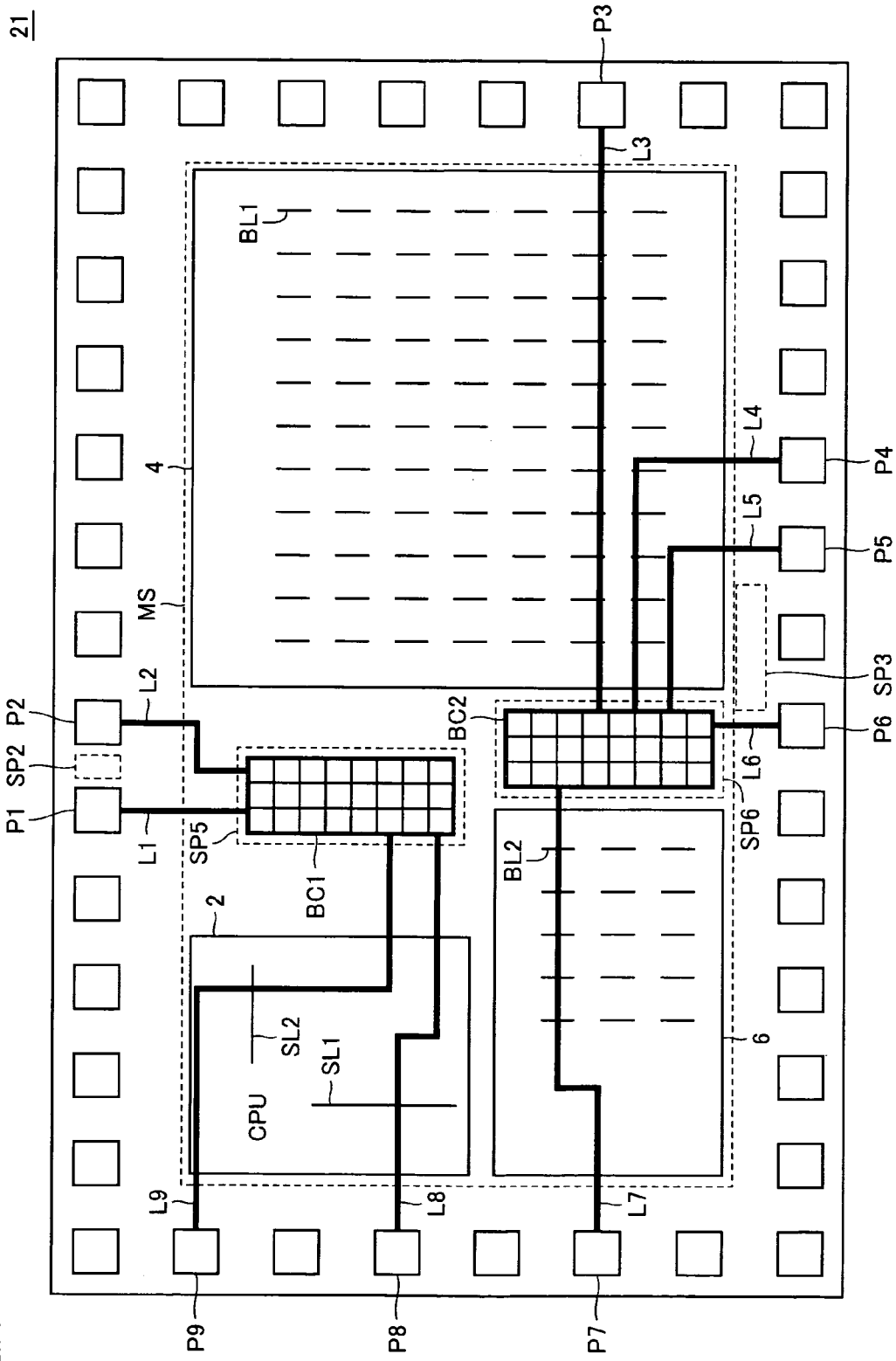
FIG. 4 shows a layout of a semiconductor integrated circuit in a second embodiment.

FIG. 4 shows a layout of a semiconductor integrated circuit in a second embodiment. Referring to FIG. 4, a semiconductor integrated circuit 21 is different from semiconductor integrated circuit 1 in FIG. 1 in including a plurality of regions SP5, SP6 instead of region SP1. In the second embodiment, the buffers (or the protection circuits) are arranged in regions SP5, SP6 as blocks. FIG. 4 shows blocks BC1, BC2 arranged in regions SP5, SP6 respectively.

As the configuration of semiconductor integrated circuit 21 is otherwise the same as that of corresponding portions of semiconductor integrated circuit 1, description thereof will not be repeated.

In the first embodiment, the buffers or the protection circuits are arranged in a concentrated manner in a single empty space. Therefore, if the area of the single empty space is smaller than the sum of the areas of the buffers or the protection circuits, it is impossible to arrange the buffers or the protection circuits in the empty space. In such a case, the chip size cannot be reduced, because the buffers or the protection circuits are arranged around the pads according to the different arrangement method.

In the semiconductor integrated circuit according to the second embodiment, so long as the total area of the plurality of empty spaces is greater than the sum of the area of the buffers or the protection circuits in spite of a small area of each of the plurality of empty spaces, the buffers or the protection circuits are arranged in each of the plurality of empty spaces so that the empty space inside the chip can efficiently be made use of. Therefore, the chip size can be reduced as in the first embodiment.

As described above, according to the second embodiment, the buffers or the protection circuits are arranged in a concentrated manner in the plurality of empty spaces inside the chip, so that the chip size can be reduced.

Third Embodiment

Figure 5:
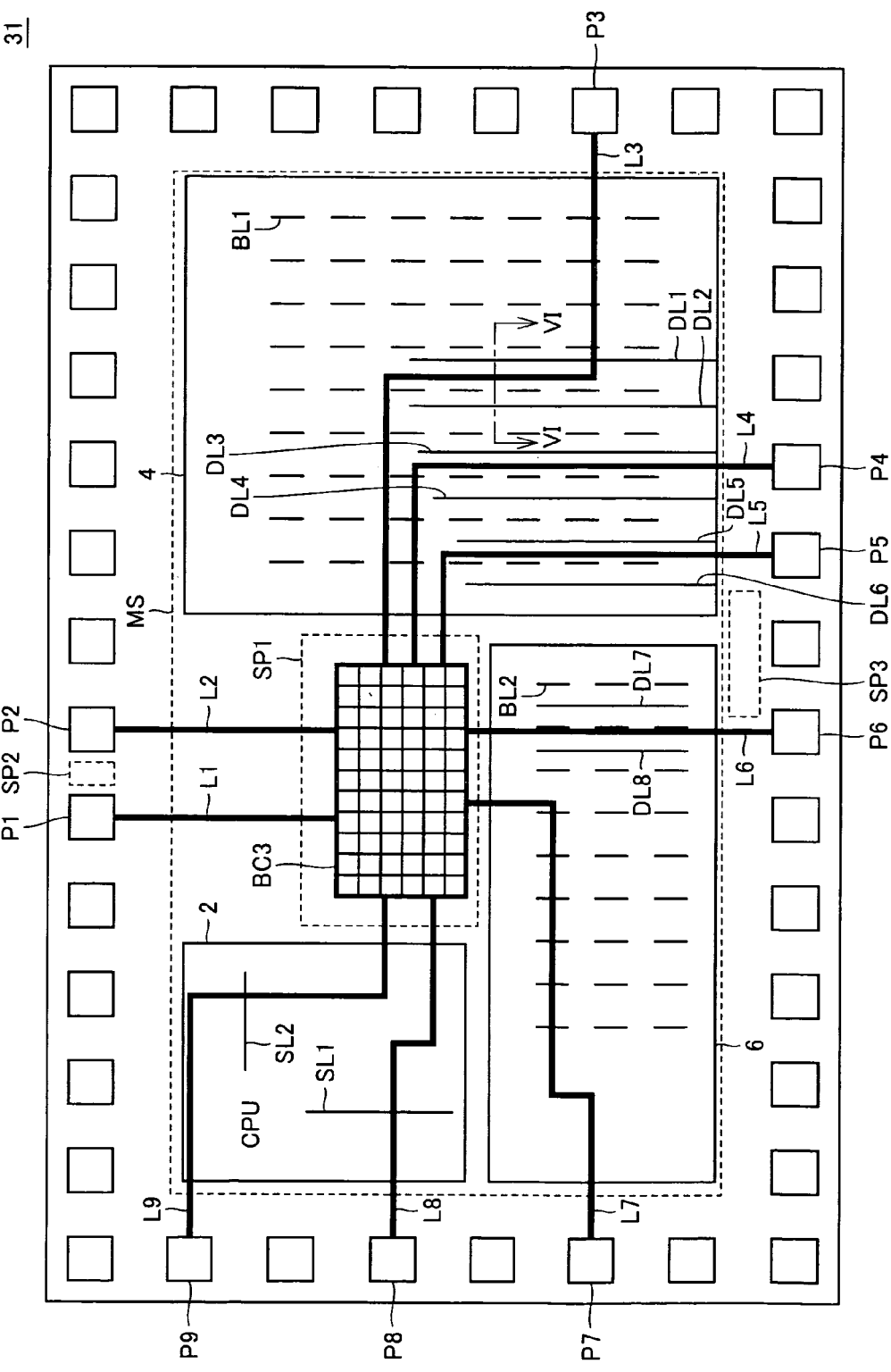
FIG. 5 shows a layout of a semiconductor integrated circuit in a third embodiment.

FIG. 5 shows a layout of a semiconductor integrated circuit in a third embodiment. Referring to FIG. 5, a semiconductor integrated circuit 31 is different from semiconductor integrated circuit 1 in FIG. 1 in further including dummy interconnections DL1 to DL8 serving as metal interconnections formed in the interconnection layer where metal interconnections L1 to L9 are provided, and supplied with a prescribed potential. As the configuration of semiconductor integrated circuit 31 is otherwise the same as that of corresponding portions of semiconductor integrated circuit 1, description thereof will not be repeated. It is noted that the buffers or the protection circuits in semiconductor integrated circuit 31 are shown as a block BC3 provided in region SP1.

The metal interconnection among the plurality of metal interconnections connecting the pad to the buffer (or the protection circuit) includes a portion extending in parallel to any one of the plurality of bit lines BL1 or any one of the plurality of bit lines BL2, and dummy interconnections DL1 to DL8 are provided so as to sandwich, from sides, the parallel portion of the metal interconnection. In FIG. 5, dummy interconnections DL1, DL2 are provided so as to sandwich from sides a portion of metal interconnection L3, that extends in parallel to bit line BL1. Similarly, dummy interconnections DL3, DL4 are provided with regard to a portion of metal interconnection L4 that extends in parallel to bit line BL1, and dummy interconnections DL5, DL6 are provided with regard to a portion of metal interconnection L5 that extends in parallel to bit line BL1. In addition, dummy interconnections DL7, DL8 are provided with regard to a portion of metal interconnection L6 that extends in parallel to bit line BL2.

In the semiconductor integrated circuit according to the present invention, a part of the metal interconnection connecting the pad to the buffer or a part of the metal interconnection connecting the pad to the protection circuit is arranged above the non-volatile memory or the volatile memory. In such a case, as a result of variation in a potential of the bit line of the non-volatile memory or of the bit line of the volatile memory provided in a lower layer in response to a signal transmitted through the metal interconnection provided in the upper layer, a phenomenon (crosstalk) in which erroneous information is read from the non-volatile memory or the volatile memory takes place.

Here, crosstalk is caused in the following manner. Namely, as the metal interconnection in the upper layer is arranged in parallel to the bit line in the lower layer, an interlayer capacitance between these interconnection layers locally becomes large. In the third embodiment, the interlayer capacitance is reduced by arranging dummy interconnections supplied with the prescribed potential on opposing sides of the metal interconnection in the upper layer, so that occurrence of crosstalk can be suppressed.

The prescribed potential supplied to the dummy interconnection can readily be set, if the prescribed potential is the power supply potential or the ground potential. Here, the ground potential is particularly preferred. In general, a ground region formed of metal and supplied with the ground potential is provided around the pad. Therefore, the dummy interconnection can readily be arranged by connecting the dummy interconnection to the ground region.

If a P-type substrate is used as the semiconductor substrate, capacitive component other than line-to-line capacitance is present between the metal interconnection and the dummy interconnection, as a result of connection of the dummy interconnection to the substrate for setting a substrate potential to the ground. Noise caused in the signal transmitted through the metal interconnection tends to be absorbed by the capacitive component other than the, line-to-line capacitance. Therefore, in order to suppress occurrence of crosstalk, the potential of the dummy interconnection is preferably set to the ground.

Figure 6:
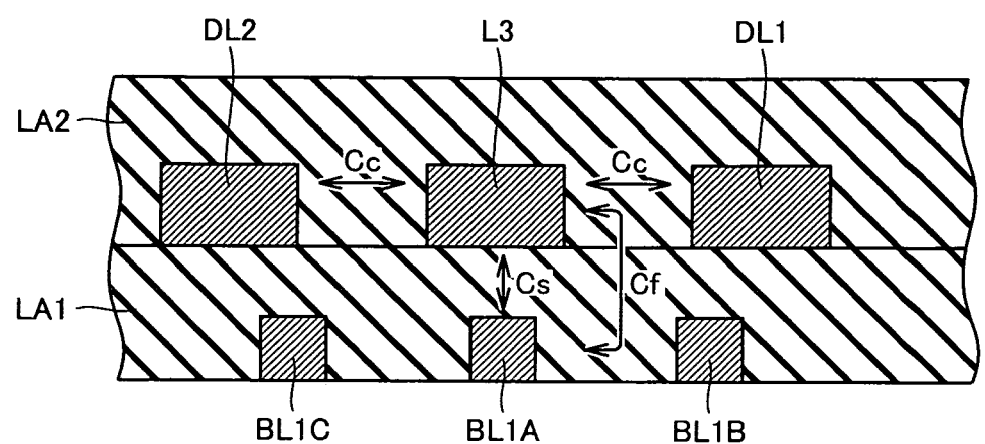
FIG. 6 is a cross-sectional view along the line VI-VI in FIG. 5.

FIG. 6 is a cross-sectional view along the line VI-VI in FIG. 5. FIG. 6 shows bit lines BL1A to BL1C of non-volatile memory 4 as well as metal interconnection L3 and dummy interconnections DL1, DL2. Metal interconnection L3 and dummy interconnections DL1, DL2 are provided in the interconnection layer above bit lines BL1A to BL1C, with an insulating film LA1 being interposed. In addition, an insulating film LA2 is provided in order to cover metal interconnection L3 and dummy interconnections DL1, DL2. If metal interconnection L3 (and dummy interconnections DL1, DL2) serves as the uppermost interconnection, insulating film LA2 serves as a protection film covering the surface of the chip.

There is interlayer capacitance present between metal interconnection L3 and bit line BL1A. The interlayer capacitance is implemented by a surface-to-surface capacitance Cs between an upper surface of bit line BL1A and a lower surface of metal interconnection L3 and a fringe capacitance Cf between a side surface of bit line BL1A and a side surface of metal interconnection L3.

In addition, there is line-to-line capacitance Cc present between metal interconnection L3 and each of dummy interconnections DL1, DL2. Here, line-to-line capacitance Cc is a capacitance between the side surface of metal interconnection L3 and a side surface of the dummy interconnection.

In general, relation of Q=CV holds, where Q represents charges, C represents capacitance, and V represents a potential. Therefore, if the interlayer capacitance is great, variation in the potential of metal interconnection L3 induces variation in the potential on bit line BL1A.

In a general memory, information read from the memory cell is produced as a potential difference between two bit lines connected to that memory cell. The potential difference between the two bit lines is sensed and amplified by a sense amplifier, to attain a logic level of either binary 1 or 0. Therefore, if the potential of one of the two bit lines is varied due to variation in the potential of metal interconnection L3 as a result of great interlayer capacitance, the potential difference produced between the two bit lines is sensed and amplified by the sense amplifier, which results in reading of erroneous information from the memory. In addition, as the capacitance is greater, a time constant becomes greater, which also leads to delay in the signal on the bit line.

Line-to-line capacitance Cc and fringe capacitance Cf implement the * capacitance with regard to the side surface of metal interconnection L3. Fringe capacitance Cf can be lowered by increasing line-to-line capacitance-Cc. If fringe capacitance Cf is lowered, the interlayer capacitance is lowered. Therefore, occurrence of crosstalk can be suppressed.

As described above, according to the third embodiment, the dummy interconnections fixed to a prescribed potential are arranged on both sides of the portion of the metal interconnection that extends in parallel to the bit line of the memory, the metal interconnection connecting the pad to the buffer or the protection circuit. Therefore, erroneous information reading from the memory can be prevented and operation reliability can be improved.

Fourth Embodiment

Figure 7:
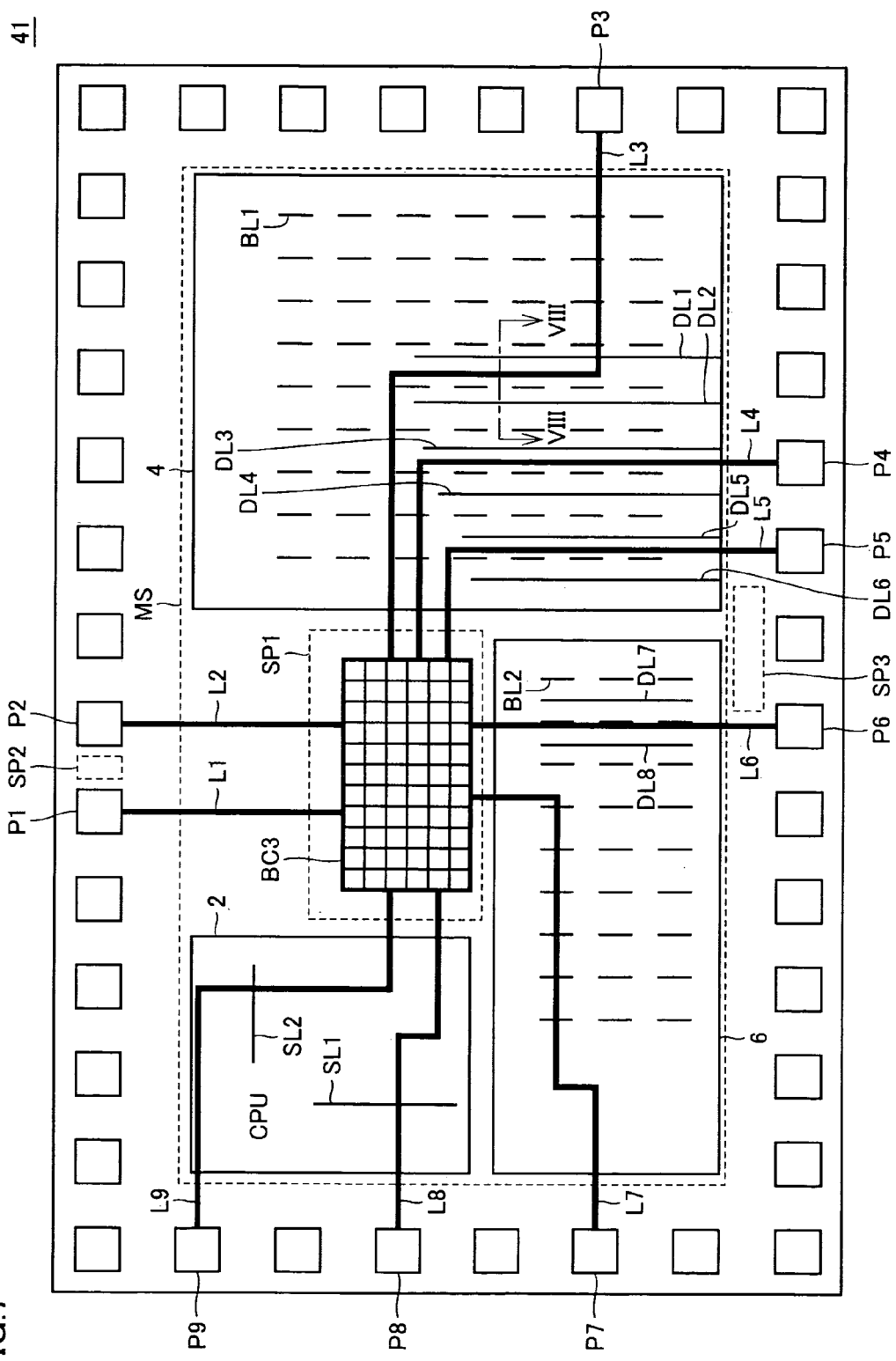
FIG. 7 shows a layout of a semiconductor integrated circuit in a fourth embodiment.

FIG. 7 shows a layout of a semiconductor integrated circuit in a fourth embodiment. Referring to FIG. 7, as the layout of a semiconductor integrated circuit 41 is similar to that of semiconductor integrated circuit 31 in FIG. 5, description thereof will not be repeated. The fourth embodiment is different from the third embodiment in that a sidewall formed of a dielectric is provided on each side surface of metal interconnections L1 to L9 and dummy interconnections DL1 to DL8.

In the fourth embodiment, the sidewall having a dielectric constant higher than that of the insulating film covering the metal interconnection and the dummy interconnection is provided in the metal interconnection and the dummy interconnection, so that the line-to-line capacitance between the metal interconnection and the dummy interconnection can be higher than in the third embodiment. Meanwhile, the fringe capacitance out of the interlayer capacitance between the metal interconnection and the bit line is lower than in the third embodiment. Since the interlayer capacitance is lower than in the third embodiment, crosstalk is less likely than in the semiconductor integrated circuit according to the third embodiment.

Figure 8:
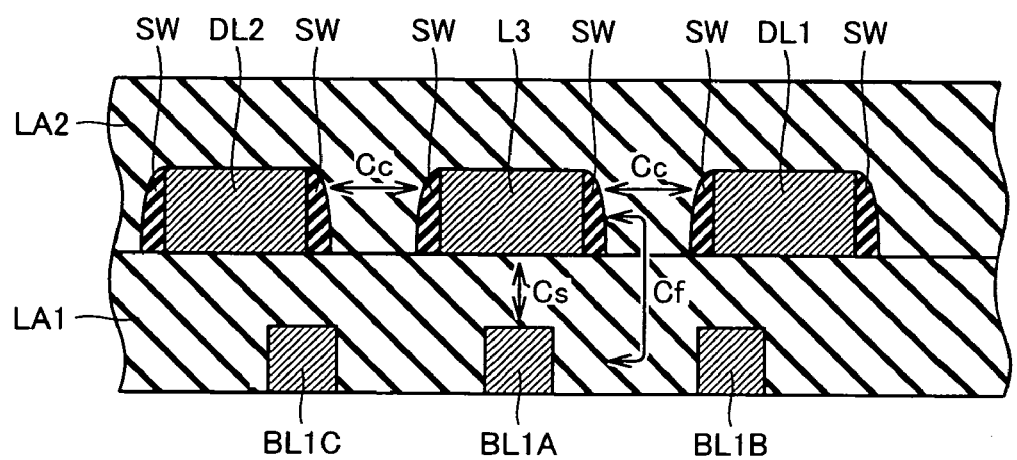
FIG. 8 is a cross-sectional view along the line VIII-VIII in FIG. 7.

FIG. 8 is a cross-sectional view along the line VIII-VIII in FIG. 7. Referring to FIG. 8, a sidewall SW is provided on opposing side surfaces of metal interconnection L3 and dummy interconnections DL1, DL2. Sidewall SW is formed of a dielectric. Sidewall SW has a dielectric constant higher than that of insulating film LA2. Sidewall SW is composed, for example, of tantalum oxide ($Ta_2O_5$), hafnium oxide ($HfO_2$) or the like. Meanwhile, insulating film LA2 is implemented, for example, by a plasma oxide film and more specifically by plasma TEOS (Tetraethylorthosilicate). If insulating film LA2 serves as a protection film, a plasma nitride film is generally used as the protection film. In other words, a material for forming sidewall SW should be a material having a dielectric constant higher than that of a plasma oxide film or a plasma nitride film.

As the dielectric constant is higher, the capacitance is greater. Comparing the fourth embodiment with the third embodiment, sidewalls SW are provided on both side surfaces of metal interconnection L3 and dummy interconnections DL1, DL2, respectively. Therefore, line-to-line capacitance Cc is greater than in the third embodiment. As the line-to-line capacitance is greater, fringe capacitance Cf can be smaller. Therefore, the interlayer capacitance can be smaller than in the third embodiment.

Figure 9:
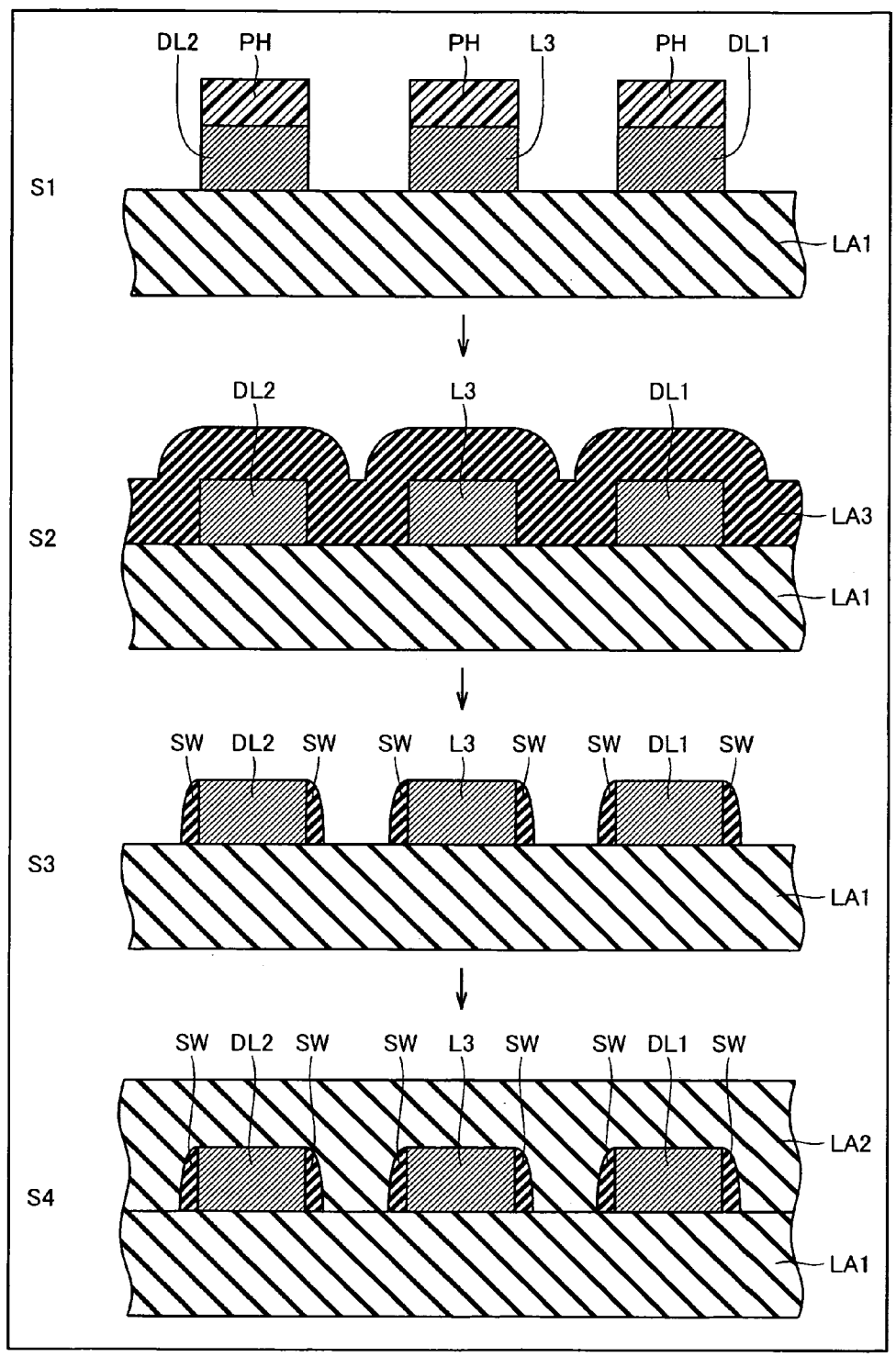
FIG. 9 schematically shows a method of manufacturing a sidewall SW in FIG. 8.

FIG. 9 schematically shows a method of manufacturing sidewall SW in FIG. 8. Referring to FIG. 9, initially at step SI, a metal film is deposited on insulating film L1A, and a photoresist PH is applied to the metal film. Thereafter, an interconnection pattern is transferred to photoresist PH in a lithography step. In an etching step, the metal film is removed except for a portion covered with photoresist PH, to form metal interconnection L3 and dummy interconnections DL1, DL2.

Thereafter at step S2, an insulating film LA3 is formed on metal interconnection L3 and dummy interconnections DL1, DL2 by plasma CVD (Chemical-Vapor Deposition). This insulating film ultimately serves as sidewall SW. Here, insulating film LA3 is an insulating film attaining isotropic step coverage.

Thereafter at step S3, anisotropic etching mainly including vertical components is carried out, to form sidewall SW.

Thereafter at step S4, insulating film LA2 (or the protection film) covering metal interconnection L3, dummy interconnections DL1, DL2 and sidewall SW is formed by plasma CVD.

As described above, according to the fourth embodiment, the sidewall formed of the dielectric is provided on the side surface of the metal interconnection and on the side surface of the dummy interconnection provided above the bit line, so that the interlayer capacitance between the interconnection in the upper layer and the bit line in the lower layer can be lowered. Erroneous information reading from the memory can thus be prevented and operation reliability is improved.

Fifth Embodiment

Figure 10:
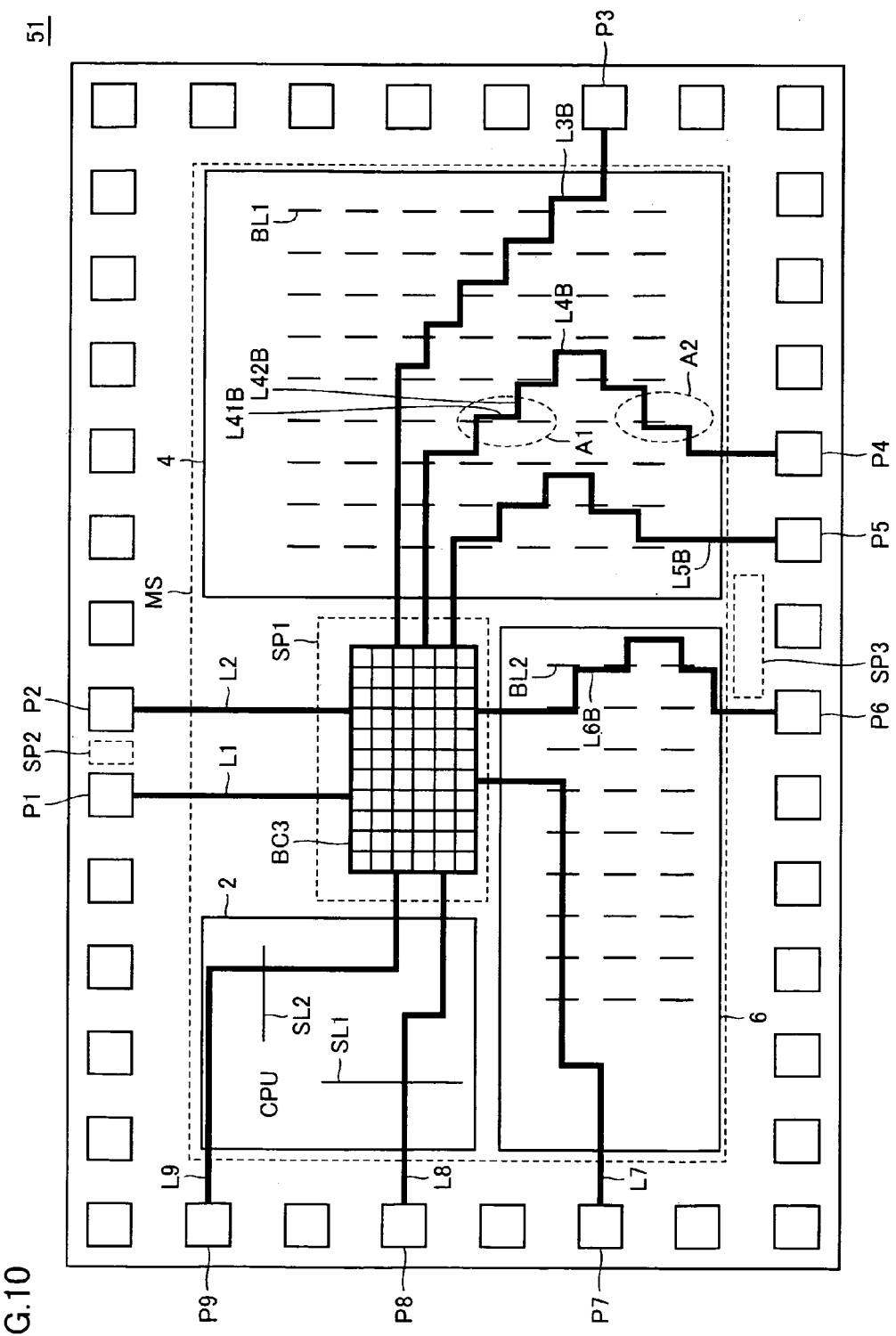
FIG. 10 shows a layout of a semiconductor integrated circuit in a fifth embodiment.

FIG. 10 shows a layout of a semiconductor integrated circuit in a fifth embodiment. Referring to FIG. 10, a semiconductor integrated circuit 51 is different from semiconductor integrated circuit 1 in FIG. 1 in including metal interconnections L3B, L4B, L5B, and L6B having a zigzag shaped portion instead of metal interconnections L3, L4, L5, and L6. As the configuration of semiconductor integrated circuit 51 is otherwise the same as that of corresponding portions of semiconductor integrated circuit 1, description thereof will not be repeated.

As described already, the interlayer capacitance implemented by the surface-to-surface capacitance and the fringe capacitance is present between the interconnection in the upper layer and the bit line in the lower layer. In the third and fourth embodiments, the interlayer capacitance is made smaller by lowering the fringe capacitance. On the other hand, in the fifth embodiment, the interlayer capacitance is made smaller by lowering the surface-to-surface capacitance.

As an area of an overlapping portion between the bit line in the lower layer and the interconnection in the upper layer is smaller, the surface-to-surface capacitance is lower. Therefore, the interconnection in the upper layer is formed in a zigzag shape so as to minimize an area of a portion in parallel to the bit line in the lower layer. More specifically, the zigzag-shaped portion is formed to bend a plurality of times, in such a manner as changing a bending direction alternately in a first direction in parallel to any one of the plurality of bit lines BL1 or any one of the plurality of bit lines BL2 and in a second direction different from the first direction, in the interconnection layer where metal interconnections L1 to L9 are formed.

For example, metal interconnection L4B will be described as a representative. Metal interconnection L4B includes bent portions A1, A2. Bent portions A1, A2 are formed to bend a plurality of times in such a manner as changing a bending direction alternately in a first direction (L41B) in parallel to bit line BL1 and in a second direction (L42B) different from the first direction (a direction perpendicular to bit line BL1). As a result of bent portions A1, A2, an area of a portion overlapping between metal interconnection L4B and one specific bit line is made smaller. As the surface-to-surface capacitance between metal interconnection L4B and the bit line in the lower layer is thus made smaller, the interlayer capacitance becomes lower.

For the sake of convenience for description, FIG. 10 shows interconnections L3B, L4B passing between bit lines BL1. In general, however, the metal interconnection connected to the pad is thicker than a width of the bit line and an interval between the bit lines. Therefore, it is impossible to arrange the metal interconnection in the upper layer in a manner not overlapping with any of the two parallel bit lines. Here, according to the fifth embodiment, the metal interconnection in the upper layer has a zigzag shape, so that the portion overlapping with the bit line in parallel can be made smaller.

An angle of bending in the zigzag-shaped portion is not limited to 90°, and any angle except for 0° and 180° may be set.

As described above, according to the fifth embodiment, the interconnection overlapping with the bit line can be in a zigzag-shape so as to make smaller an area of the portion overlapping with the bit line, whereby operation reliability can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor integrated circuit comprising:
    a central processing unit;
    a non-volatile memory storing information on processing performed in said central processing unit in a non-volatile manner;
    a volatile memory temporarily storing said information;
    a plurality of buffers or a plurality of protection circuits collectively arranged in a region on a main surface of a semiconductor substrate lying between at least two of said central processing unit, said non-volatile memory and said volatile memory;
    a plurality of pads provided corresponding to said plurality of buffers or said plurality of protection circuits, respectively; and
    a plurality of metal interconnections directly connecting said plurality of buffers or said plurality of protection circuits to corresponding ones of said plurality of pads, respectively.

2. The semiconductor integrated circuit according to claim 1, having a multilayer interconnection, wherein
    said plurality of metal interconnections are provided in an identical interconnection layer; and
    said plurality of metal interconnections are located higher than any one of an interconnection layer having a metal interconnection in said central processing unit provided, an interconnection layer having a metal interconnection in said non-volatile memory provided, and an interconnection layer having a metal interconnection in said volatile memory provided, relative to said main surface.

3. The semiconductor integrated circuit according to claim 2, wherein said plurality of buffers or said plurality of protection circuits are arranged in a single region on said main surface in a concentrated manner.

4. The semiconductor integrated circuit according to claim 2, wherein said plurality of buffers or said plurality of protection circuits are arranged in a plurality of regions on said main surface in a distributed manner.

5. The semiconductor integrated circuit according to claim 2, wherein
    said non-volatile memory has a plurality of first bit lines formed of metal;
    said volatile memory has a plurality of second bit lines formed of metal;
    said plurality of metal interconnections include a metal interconnection having a portion in parallel to any one of said plurality of first bit lines or any one of said plurality of second bit lines;
    said semiconductor integrated circuit further comprises first and second dummy interconnections formed of metal and provided in the interconnection layer having said plurality of metal interconnections provided, so as to sandwich said portion in parallel from opposing sides thereof; and
    said first and second dummy interconnections are supplied with a prescribed potential.

6. The semiconductor integrated circuit according to claim 5, wherein said prescribed potential is a power supply potential or a ground potential.

7. The semiconductor integrated circuit according to claim 5, further comprising:
   a plurality of sidewalls formed of an insulator and provided on respective side surfaces of each of said plurality of metal interconnections and on respective side surfaces of each of said first and second dummy interconnections; and
   an insulating film covering said plurality of metal interconnections, said first and second dummy interconnections and said plurality of sidewalls, wherein
   each of said plurality of sidewalls has a dielectric constant higher than that of said insulating film.

8. The semiconductor integrated circuit according to claim 2, wherein
   said non-volatile memory has a plurality of first bit lines formed of metal;
   said volatile memory has a plurality of second bit lines formed of metal; and
   said plurality of metal interconnections include a metal interconnection formed to bend a plurality of times in such a manner as changing a bending direction alternately in a first direction in parallel to any one of said plurality of first bit lines or any one of said plurality of second bit lines and in a second direction different from said first direction, in the interconnection layer having said plurality of metal interconnections formed.

* * * * *